(12) United States Patent
Huang et al.

(10) Patent No.: US 6,359,341 B1
(45) Date of Patent: Mar. 19, 2002

(54) BALL GRID ARRAY INTEGRATED CIRCUIT PACKAGE STRUCTURE

(75) Inventors: Chien Ping Huang, Hsintsu Hsien; Kevin Chiang, Taichung Hsien; Tzong Da Ho, Taichung, all of (TW)

(73) Assignee: Siliconware Precision Industries, Co., Ltd.

( * ) Notice: Subject to any disclaimer, the term of this patent is extended or adjusted under 35 U.S.C. 154(b) by 0 days.

(21) Appl. No.: 09/489,167

(22) Filed: Jan. 21, 2000

(30) Foreign Application Priority Data

Jan. 21, 1999 (TW) ........................... 88100865 A

(51) Int. Cl.[7] ............................................. H01L 29/40
(52) U.S. Cl. ................... 257/778; 257/700; 257/782
(58) Field of Search ............................. 257/738, 737, 257/778, 782, 700

(56) References Cited

U.S. PATENT DOCUMENTS 5,640,048 A    6/1997  Selna
5,825,628 A  * 10/1998  Garbelli et al. ............. 257/782
6,008,534 A  * 12/1999  Fulcher ....................... 257/778

* cited by examiner

Primary Examiner—Roy Potter
(74) Attorney, Agent, or Firm—Peter F. Corless; Steven M. Jensen; Edwards & Angell, LLP

(57) ABSTRACT

A BGA (Ball Grid Array) integrated circuit package is proposed, which is characterized in the use of a ground metallic layer adhered to a substrate. Moreover, the ground metallic layer can provide the semiconductor chip with a heat-dissipation path, allowing heat from the semiconductor chip during operation to be dissipated to the atmosphere via the ground metallic layer, so that the overall heat-dissipation efficiency can be increased. The ground metallic layer is formed with a chip-receiving cavity for accommodating a semiconductor chip mounted on the substrate. As the semiconductor chip is surrounded and in close proximity to the ground metallic layer, it can help reduce undesired simultaneous switching noise, crosstalk, and electromagnetic interference in the integrated circuit package.

20 Claims, 5 Drawing Sheets

BALL GRID ARRAY INTEGRATED CIRCUIT PACKAGE STRUCTURE

BACKGROUND OF THE INVENTION

1. Field of the Invention

This invention relates to integrated circuit (IC) packages, and more particularly, to a BGA (Ball Grid Array) integrated circuit package having arrayed solder balls as I/O leads.

2. Description of Related Art

An integrated circuit package of the ball-grid-array (BGA) type is one that includes an array of electrically-conductive balls, such as solder balls, on the bottom side of the substrate for external connections of the integrated circuit package. The BGA package allows the integrated circuit package to be able to incorporate an increased number of I/O connections as compared to the conventional QFP (Quad Flat Package) devices. This benefit allows the BGA integrated circuit package to embed high-complexity and high-performance integrated circuits therein.

One problem arising from BGA integrated circuit packages having high-complexity and high-performance semiconductor chips, however, is that electrical noise would easily occur among the electronic components and electric circuits. The primary sources of such electrical noise are, for instance, switching noise which occurs on a current path arising from rapid current switching and crosstalk which occurs in a current path resulting from mutual capacitance and inductance between two adjacent current paths. Meanwhile, mutual inductance and self-inductance of conductive routes used for transmitting electrical signals between the semiconductor die and external electronic devices are also insignificant of electrical noise.

In addition, the electromagnetic radiations from the various electronic components in the integrated circuit package would cause undesired electromagnetic interference (EMI) to the nearby electronic devices, which would adversely affect the integrated circuit operation and electronic performance. Therefore, in the design and manufacture of integrated circuit packages, it is required to reduce the electromagnetic interference to minimum.

Conventionally integrated circuit packages are typically encapsulated in a resin-made encapsulate, and since resins are poor in thermal conductivity, the dissipation of the chip-produced heat during operation would be a problem. One solution is to provide a heat sink in the package. This practice, however, would increase the overall package weight and the complexity of the fabrication process, making the manufacture of the integrated circuit package quite laborious and cost-ineffective.

FIG. 5 is a schematic sectional diagram of a conventional BGA integrated circuit package disclosed in the U.S. Pat. No. 5,640,048, which is designed to solve the above-mentioned problems. As shown, this BGA integrated circuit package, as designated by the reference numeral 50, includes a plurality of upper conductive traces 8A, 8B, 8C, 8C' and lower conductive traces 10A, 10B, 10C, 10C'. The heat produced by the semiconductor chip 12 is conducted through a thermal path composed of the upper conductive traces 8C, the vias 6C, the ground plane 60, the lower conductive traces 10C, and the solder balls 14C to the ground traces 20C on the printed circuit board 18. Since the distance between the ground plane 60 and the semiconductor chip 12 is less than the distance between the printed circuit board 18 and the semiconductor chip 12, it also allows the ground plane 60 to dissipate part of the chip-produced heat during operation, thus allowing an increased heat-dissipation efficiency. In addition, since the ground plane 60 is located at a closer position to the semiconductor chip 12 than the printed circuit board 18, it allows a reduced current return path, which can help reduce the mutual inductance between traces and hence the simultaneous switching noise. Moreover, the ground plane 60 also can help reduce the mutual coupling effect between the signal traces in the integrated circuit package, thus reducing crosstalk.

One drawback to the forgoing patent, however, is that electromagnetic interference is still a problem. Still one drawback is that the substrate of the BGA integrated circuit package is made by adhering a copper layer on the underside of a circuit board 52 having a core layer 56 sandwiched between symmetrically arranged copper layers, or alternatively on the aboveside of a circuit board 54 having a core layer 58 sandwiched between symmetrically arranged copper layers. This structure, however, cannot be manufactured by the currently-employed process for a two-layer BGA substrate, making the manufacture cost considerably high. Moreover, it is required to dimension the substrate to a thickness of up to the range from 0.02 inch to 0.03 inch (0.5 mm to 0.8 mm) for the purpose of providing sufficient rigidity to prevent the substrate from being bent and deformed during the mounting of the substrate on the circuit board. This substrate thickness, however, would make the overall package size unsatisfactorily large.

SUMMARY OF THE INVENTION

It is therefore an objective of this invention to provide a BGA integrated circuit package, which has a better heat-dissipation efficiency and an improved electronic performance than the prior art.

It is another objective of this invention to provide a BGA integrated circuit package, which can help reduce electromagnetic interference which would otherwise interfere with external electronic devices.

It is still another objective of this invention to provide a BGA integrated circuit package, which can be manufactured utilizing the existent two-layer BGA substrate so as to make the manufacture more cost-effective than the prior art.

It is yet another objective of this invention to provide a BGA integrated circuit package, which has a reduced package size as compared to the prior art.

In accordance with the foregoing and other objectives, the invention proposes an improved BGA integrated circuit package. The BGA integrated circuit package of the invention comprises: (a) a semiconductor chip; (b) a substrate on which the semiconductor chip is mounted, which is composed of a core layer interposed between first conductive traces and second conductive traces, with the first conductive traces and second conductive traces being electrically connected to each other through a plurality of vias formed in the core layer; (c) a plurality of conductive balls electrically connected to the second conductive traces; (d) a ground metallic layer disposed over the first conductive traces, which defines a chip-receiving cavity for receiving the semiconductor chip therein; (e) a set of bonding wires for electrically coupling the semiconductor chip to the first conductive traces; and (f) an encapsulate which encapsulates the semiconductor chip, the bonding wires, the first conductive traces, and the ground metallic layer.

Since the ground metallic layer is made of a metal such as copper and formed around the semiconductor chip and located near the semiconductor chip and the first conductive traces, it can shorten the current return path, thereby reducing the inductance occurring between current paths and hence the simultaneous switching noise in the integrated circuit package. Moreover, it can help reduce the crosstalk between neighboring signal traces. Still more, since the ground metallic layer can act as a shield to electromagnetic radiation, it can reduce the electromagnetic interference. In addition, a portion of the surface of the ground metallic layer may be exposed to the outside of the encapsulate whereby the ground metallic layer provides the semiconductor chip with a direct heat-dissipation part to the ambient. As a result, the heat-dissipation efficiency of the BGA integrated circuit package of the invention is improved. These benefits make the BGA integrated circuit package of the invention more advantageous to use than the prior art of the U.S. Pat. No. 5,640,048.

The first conductive traces includes first power traces, first signal traces, first ground traces, and first thermal traces; and correspondingly, the second conductive traces include second power traces, second signal traces, second ground traces, and second thermal traces. These paired traces are interconnected respectively by vias formed in the core layer of the substrate. The chip-produced heat during operation can be dissipated through a thermal path connected to the thermal traces on the printed circuit board, which is composed of the first thermal traces, the thermal vias, the second thermal traces, and the thermal solder balls.

Further, the BGA integrated circuit package is formed with a ground path composed of the ground vias, the first ground traces, the second ground traces, the ground solder balls, and the ground metallic plane. This ground path allows a shortened signal return path, thereby reducing the ground bounce.

The BGA integrated circuit package of the invention can be further incorporated with a heat-dissipation device adhered to the ground metallic layer, allowing the heat generated from the semiconductor chip to be conducted via the ground metallic layer to the heat-dissipation device for dissipation to the atmosphere through the exposed surface of the heat-dissipation device which is exposed to the outside of the encapsulate.

The semiconductor chip is accommodated within the chip-receiving cavity, thereby making the integrated circuit package of the invention lower in profile than the prior art. Moreover, as the incorporation of the ground metallic layer enhances the rigidity of the substrate, the core layer of the substrate can be reduced in thickness which allows the overall profile of the integrated circuit package of the invention to be further reduced.

The semiconductor chip can be connected to the first conductive traces through the flip-chip bonding.

In another embodiment, the ground metallic layer can be formed by interposing a core layer between two conductive metal sheets. Further, this two-layer structure can be firmly adhered to first conductive traces of the substrate through the use of a pre-preg adhesive. Since the use of the two-layer structure as the ground metallic layer provides the integrated circuit package of the invention with an increased rigidity as compared to the one used in the previous embodiments, it allows the mounting of the ground metallic layer to the substrate to be easily and conveniently carried out. As a result, the integrated circuit package of the invention can be easier and more cost-effective to manufacture than the previous embodiments.

BRIEF DESCRIPTION OF DRAWINGS

The invention can be more fully understood by reading the following detailed description of the preferred embodiments, with reference to the accompanying drawings, wherein.

DETAILED DESCRIPTION OF PREFERRED EMBODIMENTS

First Preferred Embodiment

Figure 1:
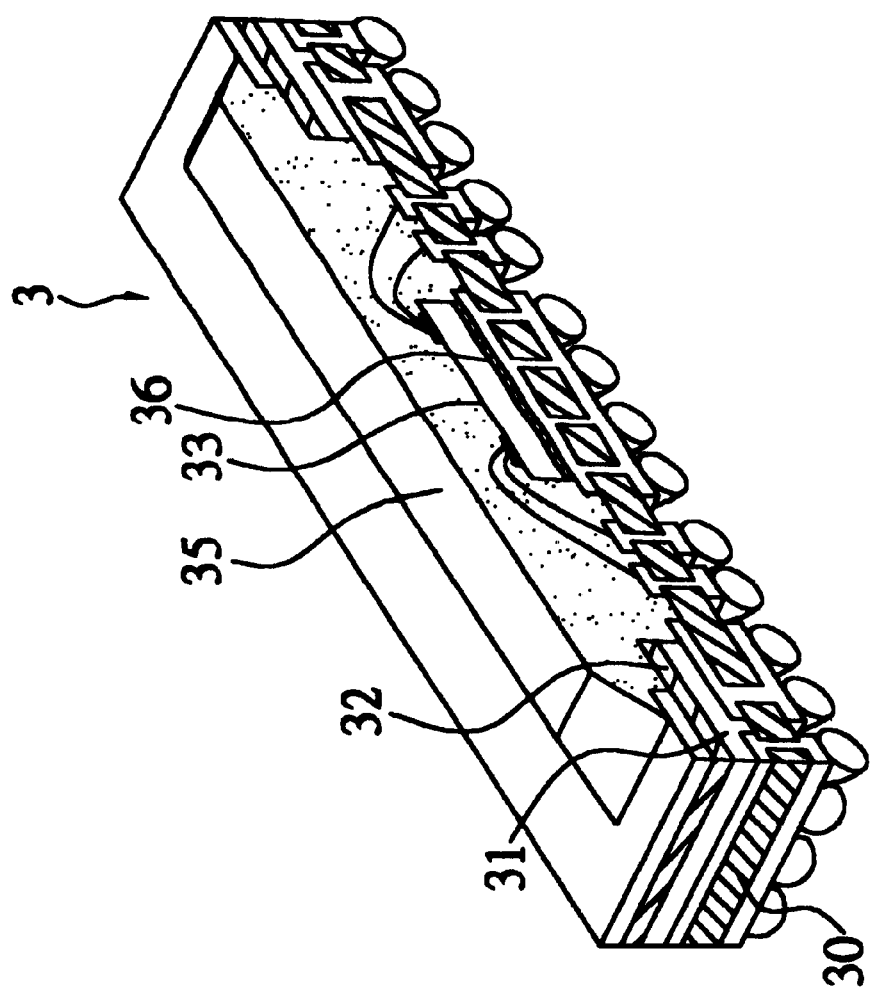
FIG. 1 is a schematic perspective diagram of the first preferred embodiment of the BGA integrated circuit package of the invention with part cut away to show the inside structure.
Figure 2:
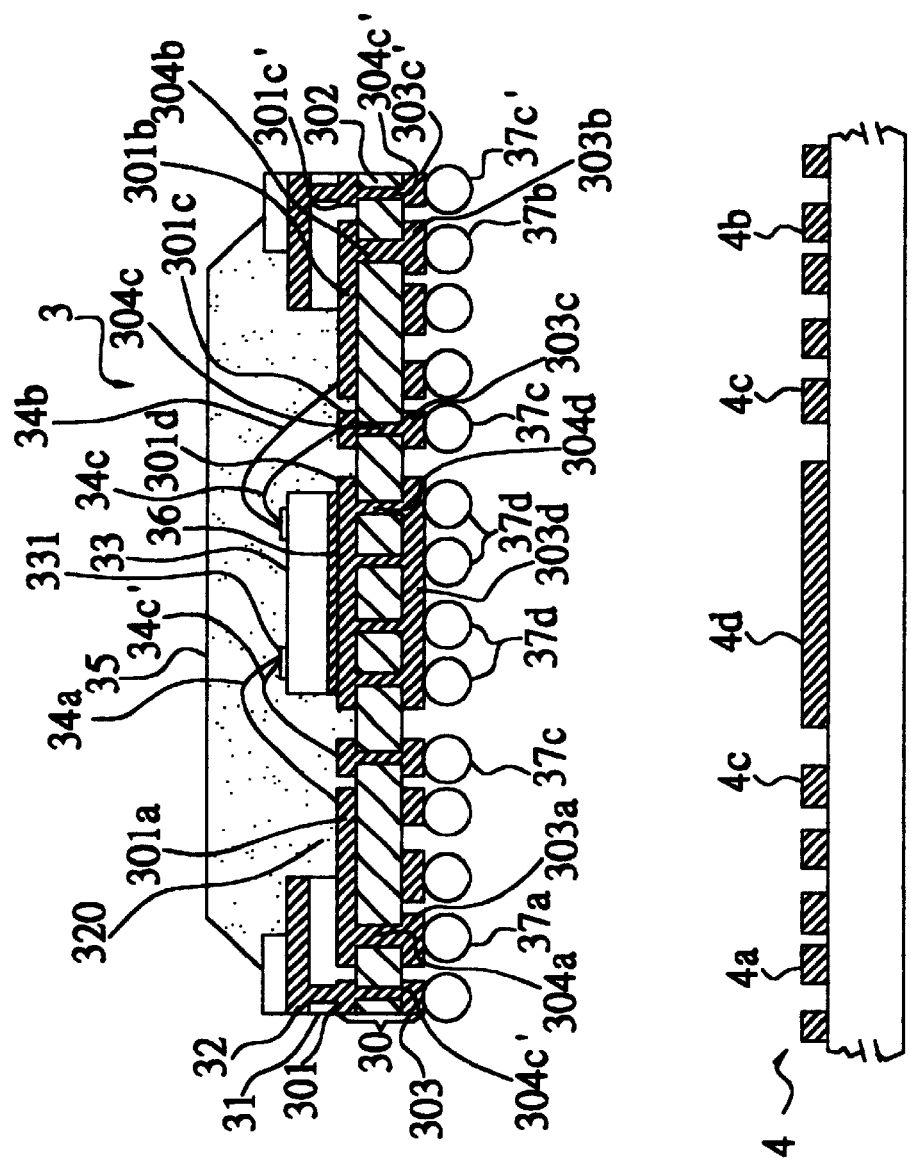
FIG. 2 is a schematic sectional diagram of the first preferred embodiment of the BGA integrated circuit package of the invention.

The first preferred embodiment of the BGA integrated circuit package of the invention is disclosed in the following with reference to FIGS. 1 and 2 (the BGA) integrated circuit package is designated by the reference numeral 3).

As shown, the package 3 is used to pack a semiconductor chip 33 on a substrate 30 having a core layer 302, first conductive traces 301 formed on the top surface of the core layer 302, and second conductive traces 303 formed on the bottom surface of the core layer 302. Further, the package 3 includes a ground metallic layer 32 mounted through a pre-preg layer 31 on the first conductive traces 301. The ground metallic layer 32 defines a chip-receiving cavity 320 which is a void portion in which the semiconductor chip 33 is accommodated. The semiconductor chip 33 is formed with a plurality of bonding pads 331 on the top surface thereof for electrically connecting the semiconductor chip 33 via bonding wires 34a, 34b, 34c to the first conductive traces 301. The electrical connection between the semiconductor chip 33 and the first conductive traces 301 can also be made by conventional flip-chip bonding. Further, an encapsulate 35 is formed by a conventional molding compound to encapsulate the semiconductor chip 33, the bonding wires 34a, 34b, 34c, and a part of the first conductive traces 301 and the ground metallic layer 32.

The first conductive traces 301 include first power traces 301a, first signal traces 301h, first ground traces 301c, and first thermal traces 301d; and correspondingly, the second conductive traces 303 include second power traces 303a, second signal traces 303b, second ground traces 303c, and second thermal traces 303d. The semiconductor chip 33 is mounted on the first thermal traces 301d through the use of silver paste 36. The core layer 302 is made of epoxy resin (preferably the FR4) or BT, and is formed with a plurality of vias, including power vias 304a, signal vias 304b, ground vias 304c, and thermal vias 304d. The power vias 304a are used to interconnect the first and second power traces 301a, 303a; the signal vias 304b are used to interconnect the first and second signal traces 301b, 303b, the ground vias 304c are used to interconnect the first and second ground traces 301c, 303c; and the thermal vias 304d are used to interconnect the first and second thermal traces 301d, 303d. The bottom side of the substrate 30 is provided with a plurality of solder balls, including a plurality of power solder balls 37a, a plurality of signal solder balls 37b, a plurality of ground solder balls 37c, and a plurality of thermal solder balls 37d, which are respectively attached to the second power traces 303a, the second stianl traces 303b, the second ground traces 303c, and the second thermal traces 303d of the second conductive traces 303. These solder balls 37a, 37b, 37c, 37d are used to electrically connect the second power traces 303a, the second signal traces 303b, the second ground traces 303c, and the second thermal traces 303d respectively to the power traces 4a, the signal traces 4b, the ground traces 4c, and the thermal traces 4d on a printed circuit board 4 on which the integrated circuit package 3 is mounted.

The semiconductor chip 33 is formed with a plurality of bonding pads 331 which are electrically coupled via a first set of gold wires 34a to the first power traces 301a, via a second set of gold wires 34b to the first signal traces 301b, and via a third set of gold wires 34c to the first ground traces 301c. The first set of gold wires 34a, the first power traces 301a, the power vias 304a, the second power traces 303a, and the power solder balls 37a in combination constitute a power transmission path for the semiconductor chip 33. During operation, the output signals from the semiconductor chip 33 are transferred to the printed circuit board 4 via a signal path composed of the second set of gold wires 34b, the first signal traces 301b, the signal vias 304b, the second signal traces 303b, and the signal solder balls 37b. Further, the semiconductor chip 33 is grounded via a ground path connected to the ground traces 4c on the printed circuit board 4, which is composed of the third set of gold wires 34c, the first ground traces 301c, the ground vias 304c, the second ground traces 303c, and the ground solder balls 37c. The chip-produced heat during operation is dissipated through a thermal path connected to the thermal traces 4d on the printed circuit board 4, which is composed of the first thermal traces 301d, the thermal trace vias 304d, the second thermal traces 303d, and the thermal solder balls 37d.

Since the ground metallic layer 32 is formed around and in close proximity to the semiconductor chip 33 and the first conductive traces 301, it can shorten the current return path, thereby reducing the mutual inductance between conductive traces and hence the simultaneous switching noise in the integrated circuit package. Moreover, it can help reduce the crosstalk between neighboring signal traces. Still more, since the ground metallic layer 32 an ast as a shield to electromagnetic radiation, it can reduce the electromagnetic interference which would interfere with nearby electronic components. These benefits make the BGA integrated circuit package of the invention more advantageous to use than the prior art.

The core layer 302 in the substrate 30 is further formed with a plurality of ground vias 304C' for interconnecting the first outer ground traces 301C' on the periphery of the first conductive traces 301 with the second outer ground traces 303C' on the periphery of the second conductive traces 303. Moreover, a plurality of ground solder balls 37c' are electrically connected to the second outer ground traces 303C'. This constitutes a ground path on the periphery of the package 3, which is composed of the ground metallic layer 32, the first outer ground traces 301C', the ground vias 304C', the second outer ground traces 303C', and the ground solder balls 37c'. This periphery ground path allows the reductive of ground bounce in the package 3.

Since the ground metallic layer 32 is fixedly mounted on the substrate 30 through the use of the adhesive layer 31, the substrate 30 can be a conventional type of two-layer substrate, without having to use a custome-made one, allowing the BGA integrated circuit package of the invention to be more cost-effective to manufacture than the prior art of the U.S. Pat. No. 5,640,048. The adhesive layer 31 can be made of either polyimides or epoxy resins. If it is desired to make the adhesive layer 31 electrically insulative, ceramics can be filled therein; whereas if it is desired to make the adhesive layer 34 electrically conductive, silver powder can be filled therein. By the invention, the encapsulant 35 encapsulates only the inner part of the ground metallic layer 32, allowing the outer part of the ground metallic layer 32 to be exposed to the atmosphere, so that the heat produced by the semiconductor chip 33 during operation can be dissipated directly through the ground metallic layer 32 to the atmospher, making the BGA integrated circuit package of the invention higher in heat-dissipation efficiency than the prior art. To further increase the heat-dissipation efficiency, ceramic fillers can be filled into the adhesive layer 31.

The chip-receiving cavity 320 defined by the ground metallic layer 32 is formed in such a manner that is projected area on the first conductive traces 301 is uncoated with the adhesive layer 31, allowing the first conductive traces 301 to pass directly therethrough to within the chip-receiving cavity 320 for the mounting of the semiconductor chip 33. The semiconductor chip 33 needs not to be entirely received within the chip-receiving cavity 320, i.e., its top can be either higher or lower than top surface of the ground metallic layer 32. This allows the distance between the bottom side of the substrate 30 and the top surface of the ground metallic layer 32 to be within the range of from 0.02 inch to 0.03 inch (0.5 mm to 0.8 mm). This thickness allows the combined structure of the substrate 30 and the ground metallic layer 32 to be rigid enough so that it would not be deformed when mounting the substrate 30 onto the printed circuit board 4. Moreover, it allows the overall package profile to be lower than the prior art of U.S. Pat. No 5,640,048.

In order to protect the exposed part of the ground metallic layer 32, i.e. the part uncovered by the encapsulatnt 35, against oxidation, a solder mask or an anti-oxidation agent can be coated thereon.

Second Preferred Embodiment

Figure 3:
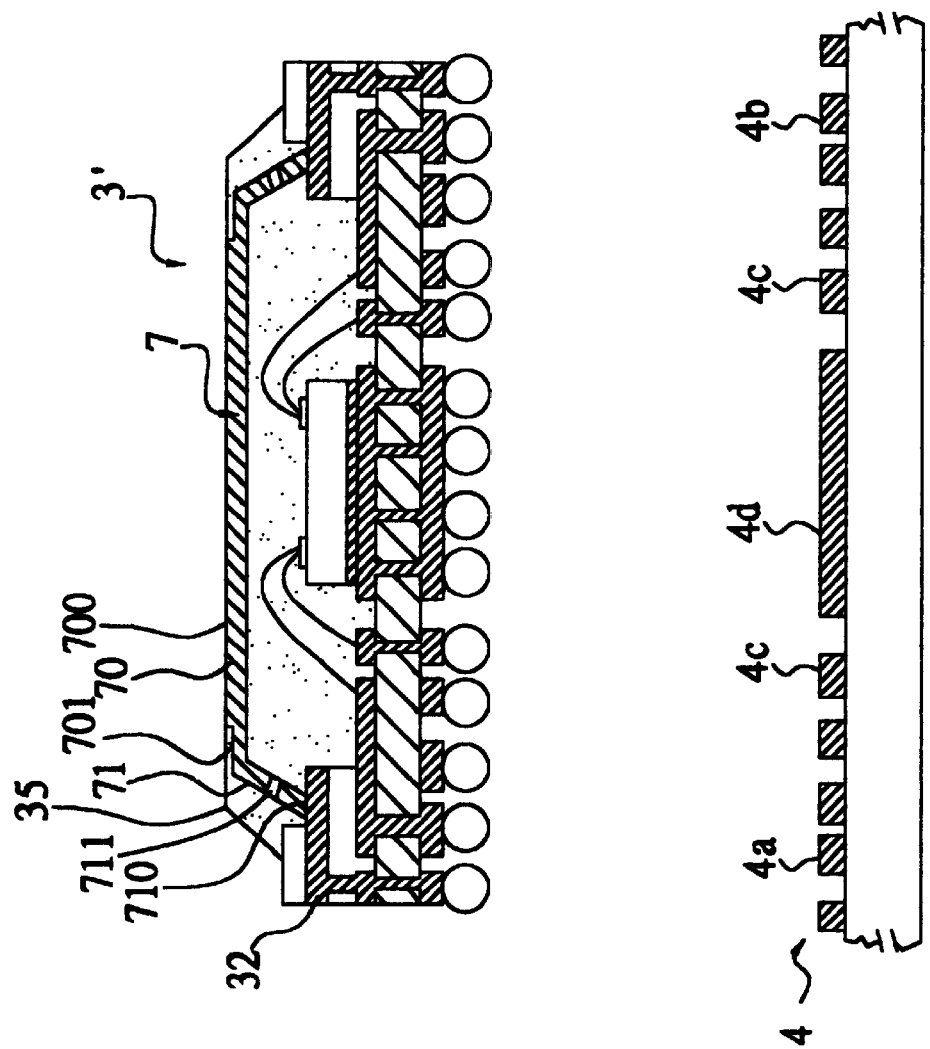
FIG. 3 is a schematic sectional diagram of the second preferred embodiment of the BGA integrated circuit package of the invention.

FIG. 3 is a schematic sectional diagram of the second preferred embodiment of the BGA integrated circuit package of the invention (here designated by the reference numeral 3').

The package 3' of this embodiment differs from the previous one only in the additional incorporation of a heat spreader 7 having a flat portion 70 and a skirt portion 71 and made of a thermally-and-electrically-conductive material. The top surfaced 700 of the flat portion 70 is preferably exposed to the outside of the encapsulate 35; but it can also be entirely encapsulated in the encapsulate 35, though this would result in a slightly reduce heat-dissipation efficiency. The skirt portion 71 has a bottom end 710 come in thermally-conductive contact with the ground metallic layer 32 and is preferably bonded to the ground metallic layer 32, allowing the heat in the ground metallic layer 32 to be conducted to the heat spreader 7 for dissipation to the atmosphere through the exposed top surface 700 of the heat spreader 7. Further, a slot 701 can be formed in the flat portion 70 of the heat spreader 7, and additionally a plurality of through holes 711 can be formed in the skirt portion 71, which allow the molding resin used in the molding process to fill therein, thereby providing an anchoring effect that can help secure the heat spreader 7 more fixedly in position in the encapsulate 35.

By the invention, the heat spreader 7 is made of electrically conductive material; and therefore, it can act as a shield for electromagnetic radiation, thus preventing the electromagnetic interference which would interfere with nearby electronic components.

Third Preferred Embodiment

Figure 4:
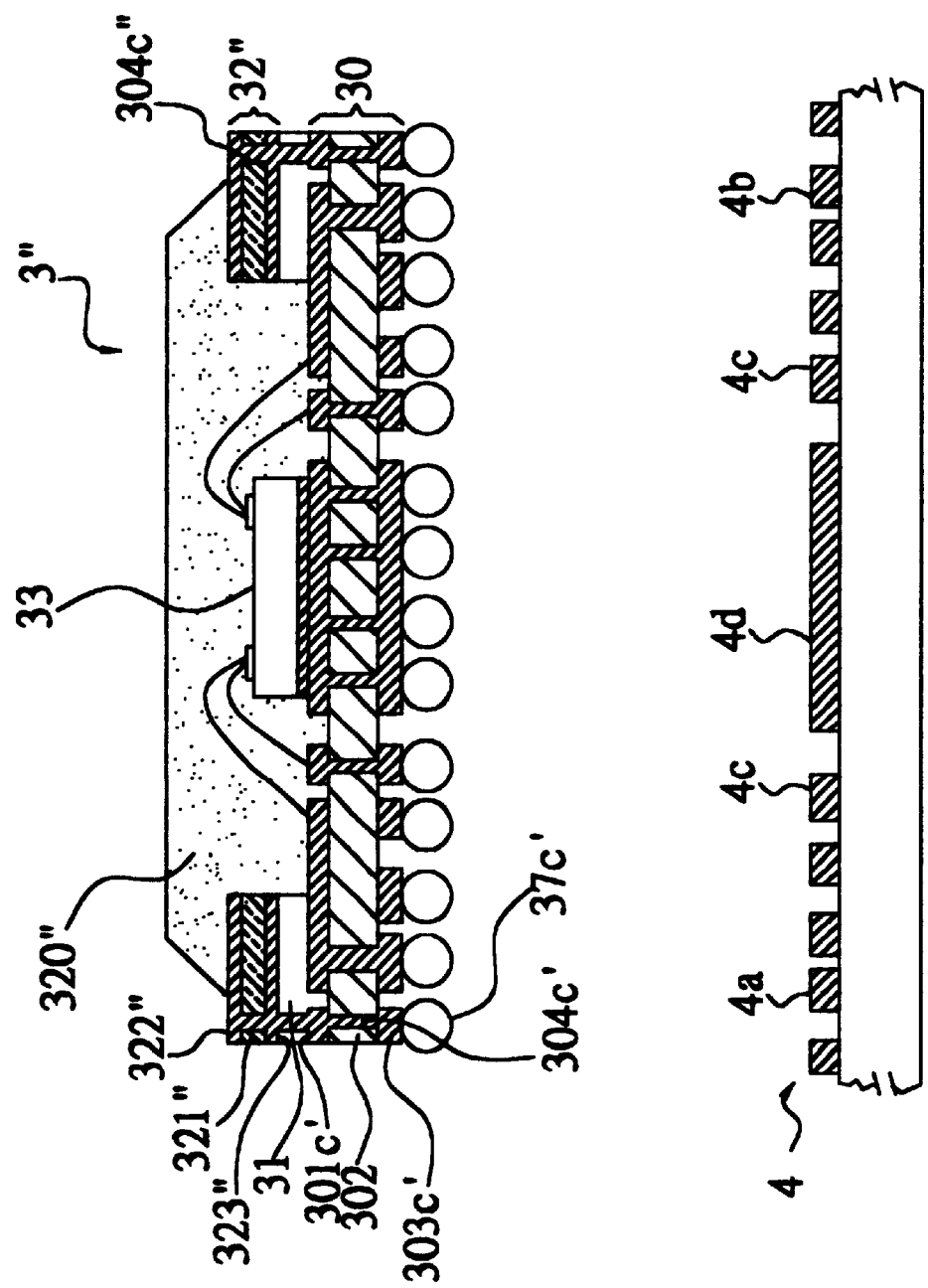
FIG. 4 is a schematic sectional diagram of the third preferred embodiment of the BGA integrated circuit package of the invention.
Figure 5:
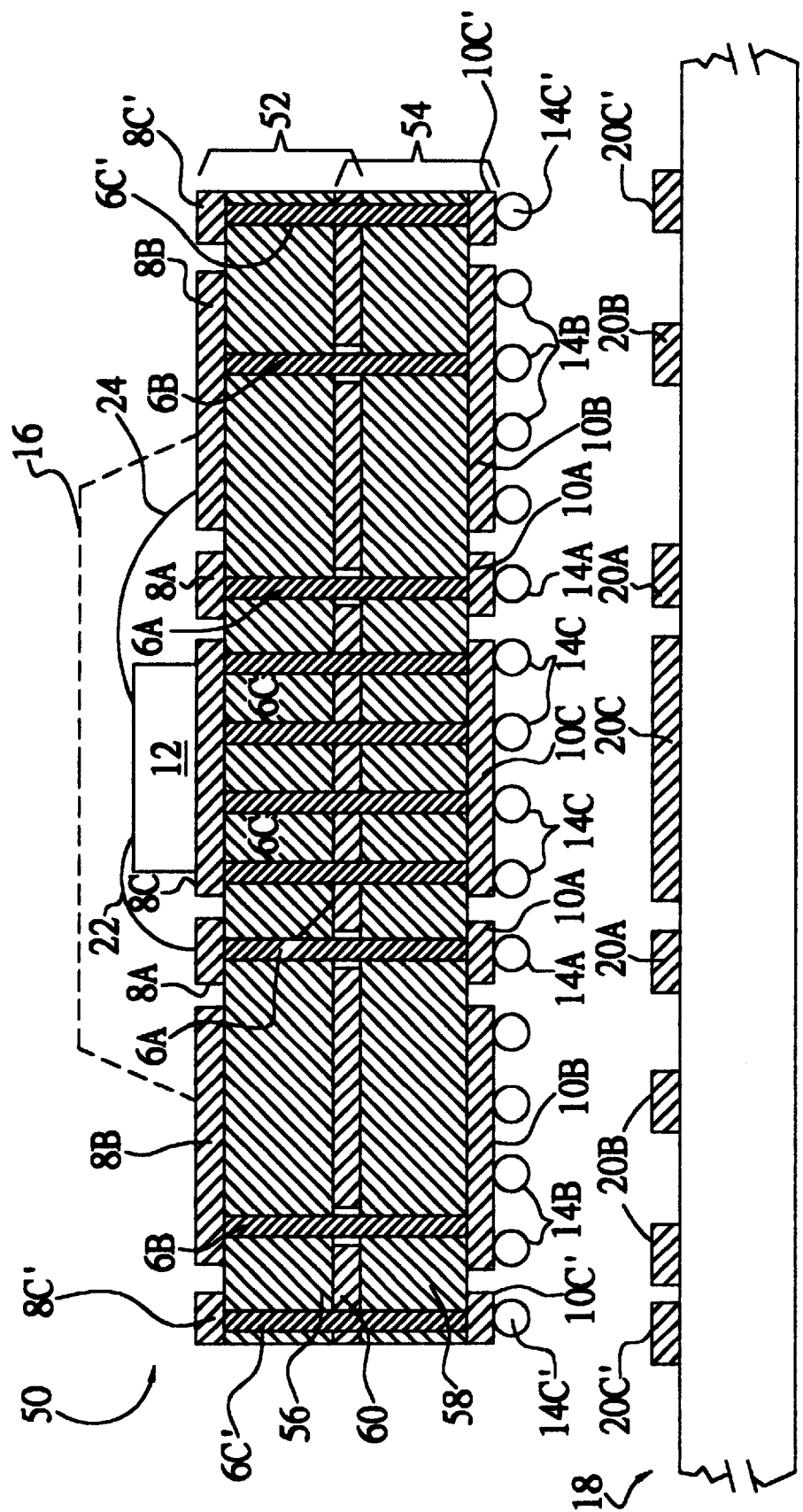
FIG. 5 (PRIOR ART) is a schematic sectional diagram of a conventional BGA integrated circuit package.

FIG. 4 is a schematic sectional diagram of the third preferred embodiment of the BGA integrated circuit package of the invention (here designated by the reference numeral 3").

The package 3" of this embodiment differs from the two previous embodiments particularly in the use of a two-layer substrate structure 32" in lieu of the metal layer 32 used in the previous embodiments. The two-layer substrate structure 32" is composed of a core layer 321" which is sandwiched by a first metal sheet 322 " on the top and a second metal sheet 323" on the bottom. Further, this two-layer substrate structure 32" is fixedly mounted to the first conductive traces 301 through the use of a pre-preg layer 31. Since the two-layer substrate structure 32" used in this embodiment has an increased rigidity as compared to the metal layer used in the previous embodiments, it allows the two-layer substrate structure 32" to be easily adhered to the substrate 30. As a result, the package 3" is easier and more cost-effective to manufacture than the previous embodiments.

Further, a plurality of vias 304c' are formed in the core layer 302 of three substrate 30 and electrically connected to the second metal sheet 323", and a plurality of vias 304c" is formed to penetrate through the second metal sheet 3232" and electrically connected to the first metal sheet 322" and the second metal sheet 323". Therefore, a ground path is formed to be composed of the vias 304c' and 304", the first ground traces 301c', the second ground traces 303c', the ground solder balls 37c', and the first metal 322" and second metal sheet 323". This ground path allows a shorter signal return path, thereby reducing the ground bounce.

Moreover, due to the use of the two-layer substrate structure 32' which includes two metal sheets 322", 323", the package 3" can be more safely protected against electromagnetic radiation, thus reducing the undesired electromagnetic interference. In addition, these two metal sheets 322", 323" can serve as heat-dissipation means, significantly increasing the heat-dissipation efficiency to dissipate heat from the semiconductor chip 33.

The invention has been described using exemplary preferred embodiments. However, it is to be understood that the scope of the invention is not limited to the disclosed embodiments. On the contrary, it is intended to cover various modifications and similar arrangement. The scope of the claims, therefore, should be accorded the broadest interpretation so as to encompass all such modifications and similar arrangements.

What is claimed is:

1. A BGA integrated circuit package, which comprises:
   a semiconductor chip;
   a substrate on which the semiconductor chip is mounted, which is composed of a core layer interposed between first conductive traces and second conductive traces, with the first conductive traces and second conductive traces being electrically interconnected to each other through a plurality of vias formed in the core layer;
   a plurality of conductive balls electrically coupled to the second conductive traces;
   a ground metallic layer adhered on the first conductive traces, which defines a chip-receiving cavity for accommodating the semiconductor chip therein;
   a plurality of bonding wires for electrically connecting the semiconductor chip to the first conductive traces; and
   an encapsulate which encapsulant the semiconductor chip, the bonding wires, the first conductive traces, and the ground metallic layer.

2. The BGA integrated circuit package of claim 1, wherein the ground metallic layer is a metal sheet.

3. The BGA integrated circuit package of claim 2, wherein the metal sheet is made of copper.

4. The BGA integrated circuit package of claim 1, wherein the ground metallic layer is composed of a core layer interposed between two metal sheets.

5. The BGA integrated circuit package of claim 4, wherein the metal sheets are made of copper.

6. The BGA integrated circuit package of claim 1, further comprising:
   a heat-dissipation device which is encapsulated in the encapsulant and comes into thermally-conductive contact with the ground metallic layer.

7. The BGA integrated circuit package of claim 6, wherein the heat-dissipation device has a surface exposed to the outside of the encapsulant.

8. The BGA integrated circuit package of claim 6, wherein the heat-dissipation device is formed with a flat portion and a skirt portion bending from edges of the flat portion.

9. The BGA integrated circuit package of claim 8, wherein the skirt portion of the heat-dissipation device comes into thermally-conductive contact with the ground metallic layer.

10. The BGA integrated circuit package of claim 9, wherein the skirt portion of the heat-dissipation device is adhered to the ground metallic layer through a thermally-conductive adhesive.

11. The BGA integrated circuit package of claim 8, wherein the flat portion of the heat-dissipation device is formed with a slot for use to provide an anchoring effect to the heat-dissipation device by the encapsulant.

12. The BGA integrated circuit package of claim 8, wherein the skirt portion of the heat-dissipation device is formed with a plurality of through holes for use to provide an anchoring effect to the heat-dissipation device by the encapsulant.

13. The BGA integrated circuit package of claim 1, wherein the ground metallic layer is adhered on the first conductive traces through an electrically-conductive adhesive layer.

14. The BGA integrated circuit package of claim 1, wherein the top surface of the semiconductor chip is higher in elevation than the top surface of the ground metallic layer.

15. The BGA integrated circuit package of claim 1, wherein the semiconductor chip is entirely received inside the chip-receiving cavity defined by the ground metallic layer.

16. The BGA integrated circuit package of claim 1, wherein the semiconductor chip is coupled to a ground path composed of first ground traces in the first conductive traces, vias formed in the core layer of the substrate and connected to the first ground traces, second ground traces in the second conductive traces, and the ground metallic layer.

17. The BGA integrated circuit package of claim 1, wherein the first conductive traces includes first thermal traces thermally-conducively coupled to the semiconductor chip, while the second conductive traces include second thermal traces having first ends connected through vias formed in the core layer of the substrate to the first thermal traces and second ends connected to the conductive balls, constituting a thermal path for the semiconductor chip.

18. The BGA integrated circuit package of claim 1, wherein the ground metallic layer has an inner part encapsulated in the encapsulant and an outer exposed to the outside of the encapsulant.

19. The BGA integrated circuit package of claim 1, wherein the core layer of the substrate is made of polyimide.

20. The BGA integrated circuit package of claim 1, wherein the semiconductor chip is mounted on the first conductive traces through flip chip bonding.

* * * * *